United States Patent
Wong et al.

(10) Patent No.: US 7,517,834 B2
(45) Date of Patent: Apr. 14, 2009

(54) HIGH TEMPERATURE SUPERCONDUCTING (HTS) TAPE COIL WITH ENHANCED PROTECTION AND METHOD FOR MAKING SAME

(75) Inventors: Yum Wing Wong, New Territories (HK); Edward S. Yang, Menlo Park, CA (US)

(73) Assignee: The University of Hong Kong, Hong Kong (CN)

( * ) Notice: Subject to any disclaimer, the term of this patent is extended or adjusted under 35 U.S.C. 154(b) by 207 days.

(21) Appl. No.: 11/626,061

(22) Filed: Jan. 23, 2007

(65) Prior Publication Data

US 2007/0170922 A1 Jul. 26, 2007

Related U.S. Application Data

(60) Provisional application No. 60/762,012, filed on Jan. 24, 2006.

(51) Int. Cl.
*H01L 39/24* (2006.01)
*B05D 5/12* (2006.01)

(52) U.S. Cl. .................. 505/433; 505/230; 505/430; 505/434; 505/813; 427/63; 427/62

(58) Field of Classification Search .................. 427/63, 427/62; 505/430, 433, 434, 813, 230
See application file for complete search history.

(56) References Cited

U.S. PATENT DOCUMENTS

| | | | | |
|---|---|---|---|---|
| 5,434,129 A | * | 7/1995 | Motowidlo et al. | 505/433 |
| 5,567,673 A | * | 10/1996 | Face et al. | 505/329 |
| 5,882,536 A | * | 3/1999 | Balachandran et al. | 216/43 |
| 6,170,147 B1 | * | 1/2001 | Yamada et al. | 29/599 |
| 6,294,738 B1 | * | 9/2001 | Seuntjens | 174/125.1 |
| 6,436,317 B1 | * | 8/2002 | Malozemoff et al. | 252/519.1 |
| 6,555,256 B1 | * | 4/2003 | Christen et al. | 428/697 |
| 6,943,550 B2 | | 9/2005 | Cheng et al. | |
| 2003/0091869 A1 | * | 5/2003 | Otto et al. | 428/697 |
| 2004/0222186 A1 | * | 11/2004 | Cheng et al. | 216/43 |
| 2005/0059554 A1 | * | 3/2005 | Long et al. | 505/100 |
| 2007/0145100 A1 | * | 6/2007 | Suzuki et al. | 228/101 |

OTHER PUBLICATIONS

Ma, Y.Q.; *RF Applications of High Temperature Superconductors in $MH_z$ Range*; IEEE Trans. On Applied Supercon., 9, 3565 (1999).
Cheng, C. M., et al.; *HTS Tape RF Coil for Field MRI*; Proc. Intl, Soc. Magn. Reson. Med., (2003).
Black, D.R.; *A High-Temperature Superconducting Receiver for Nuclear Magnetic Resonance Microscopy*; Science 159, 793 (1993).
Lee H.K et al.; *Performance of Large-Size Superconducting Coil in 0.21T MRI System*; IEEE Trans. on Biom. Eng., 51, 2024 (2004).

* cited by examiner

*Primary Examiner*—Douglas Mc Ginty
(74) *Attorney, Agent, or Firm*—Robert D. Katz; Cooper & Dunham LLP

(57) ABSTRACT

The invention provides an improved method of manufacturing an HTS tape coil for an MRI device with enhanced protection, the method comprising attaching high-Q capacitors at each end of an HTS wire, removing substantially all electrically conductive sheathing material on an inner side of the HTS wire, while retaining substantially all electrically conductive sheathing material on an outer side of the HTS wire. The invention also provides an HTS wire made in accordance with the foregoing method.

10 Claims, 3 Drawing Sheets

HIGH TEMPERATURE SUPERCONDUCTING (HTS) TAPE COIL WITH ENHANCED PROTECTION AND METHOD FOR MAKING SAME

CROSS-REFERENCE TO RELATED APPLICATION

This application claims the benefit of U.S. Provisional Patent Application Ser. No. 60/762,012, filed Jan. 24, 2006, the entire contents of which is included by reference herein.

FIELD OF THE INVENTION

This invention relates to superconducting receiver tape coils for magnetic resonance imaging (MRI) having enhanced protection from bending strain, and to methods for making the same. All publications and patents referred to below are incorporated by references herein.

BACKGROUND OF THE INVENTION

Receiver coils using High-Temperature Superconducting (HTS) materials are able to achieve higher quality factor (Q-factor) than conventional copper coils, thus higher signal-to-noise ratio (SNR) or shorter imaging time. Ma, "RF Applications of High Temperature Superconductors in MHz Range," *IEEE Trans. on Applied Supercon.*, 9, 3565-3568 (1999), describes the use of expensive HTS thin film receiver coil for substantial SNR improvements.

HTS wire or tape is later used to fabricate receiver coil. Cheng et al., "HTS Tape RF Coil for Low Field MRI," *Proc. Intl. Soc. Magn. Reson. Med.*, (2003), demonstrates a 5-inch HTS tape receiver coil, which possesses the advantages of lower cost, enhanced filling factor and flexible coil design over traditional HTS thin films, while significant SNR improvement can still be achieved.

Black et al., "A High-Temperature Superconducting Receiver for Nuclear Magnetic Resonance Microscopy," *Science* 159, 793-795 (1993), implies that it is most beneficial to use HTS coil for small-size sample or low-field system. Such applications include mice imaging, which is important for basic research and clinical investigations. However, removal of all the electrically conductive materials results in very brittle HTS tape coils. Relatively large recoil force experienced by small-size tape coils makes their fabrication even more difficult.

It is, therefore, an object of the invention to provide a method to protect the small-size HTS tape coils such that their fabrication is made easier and thus enjoys the advantages of having a HTS tape coil over conventional copper coils.

SUMMARY OF THE INVENTION

The present invention provides a method of manufacturing an HTS tape coil for an MRI device such that protection for the coil is enhanced. The method comprises attaching high-quality capacitors at each end of an HTS wire; removing only the electrically conductive materials covering the inner side such that the electrically conductive material on its outer side can act as a protective layer to resist bending strain for tape coil.

The invention also provides a method of manufacturing an HTS tape coil for an MRI device using an etching device, wherein the etching device comprises an HTS wire attached with high-Q capacitors at each end, a strong but flexible strip that tightly confines the HTS wire and minimizes contact of etching solution on the outer side of the HTS wire, and a support that maintains the strip in a smooth circular shape.

The invention further provides an HTS tape coil made by one of the foregoing methods.

BRIEF DESCRIPTION OF THE FIGURES

Further features and advantages of the invention may be understood with reference to the drawings in conjunction with the drawings in which.

DETAILED DESCRIPTION OF THE PREFERRED EMBODIMENTS

High temperature superconducting (HTS) material is used for building HTS tape receiver coil. In a preferred embodiment, HTS wire composed of Bi-2223 compound is adopted. The commercially available HTS wire, however, cannot be directly used for RF application due to screening of RF signal from superconducting core by coatings of electrically conductive materials. U.S. Pat. No. 6,943,550 (Cheng), incorporated herein by reference, discloses a method of manufacturing HTS tape receiver coil for Magnetic Resonance Imaging (MRI).

However, relatively large recoil force is experienced by small-size HTS tape coil. The removal of the entire electrically conductive coatings (the silver sheath), as suggested by above method, will largely reduce its ability to resist the large bending strain encountered in use, making fabrication of small-size HTS tape coil very difficult. Using the present method, protection for HTS tape coil will be enhanced, in particular for those of small-size. At the same time, substantial signal-to-noise ratio improvements can be achieved over conventional copper coil.

Figure 1:
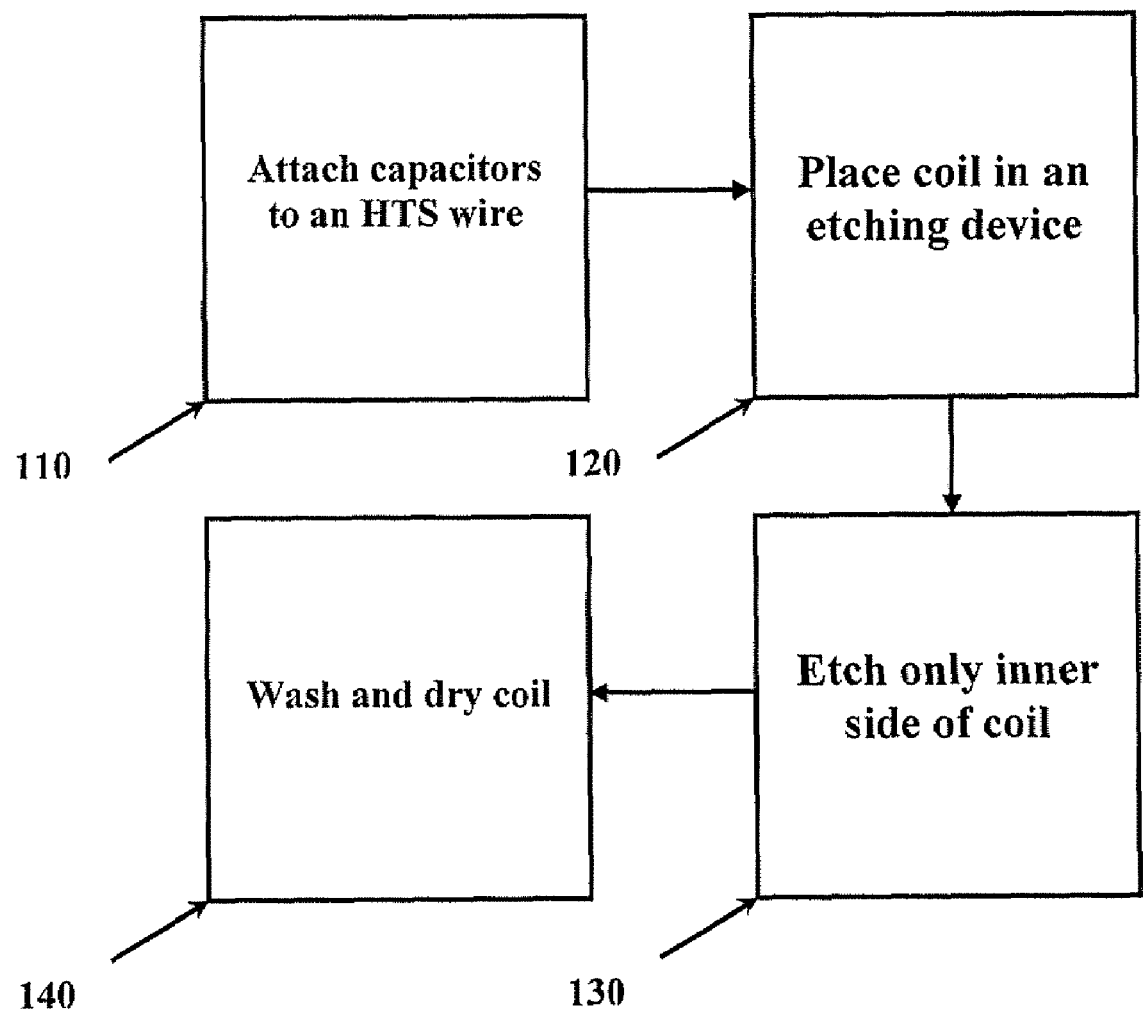
FIG. 1 is a process flow diagram illustrating one embodiment of the present invention.

FIG. 1 is a process flow diagram illustrating one embodiment of the present invention. In step 110, an HTS wire is attached with capacitors at its two ends. Preferably, a portion of HTS wire is cut to a length slightly shorter than the desired circumference of coil, and carefully wound onto a smooth cylinder to assume its shape without bending. The HTS wire (available from American Superconductor) is attached with high quality (High Q) capacitors at both of its two ends using low resistance solder, composed of 63% and 37% lead, available from Straits Metal Technology. A High Q capacitor exhibits low loss characteristics in a resonant circuit. Such a High Q capacitor is available for example from American Technical Ceramics. The capacitors are chosen such that the resulting resonant frequency of the LC circuit is close to that of the sample.

In step 120, an etching device is used to expose the coil such that only the inner side of the silver sheath is removed. The outer side of silver sheath is retained to act as a protective layer for the coil to resist bending strain, which is particularly useful for HTS tape coil of small-size where the recoil force is relatively large.

In step 130, the HTS tape coil, together with the etching device, is immersed in the etching solution until the inner side of silver sheath is removed in order to avoid screening of RF signal from superconducting core. The HTS tape coil is etched until the removal of silver sheath is substantially complete on the inner side of the coil. In a preferred embodiment, the etching solution comprises 40% ammonium hydroxide, 20% hydrogen peroxide, and 40% de-ionized water. In step 140, the coil is washed in a de-ionized water bath to remove the remaining etching solution from the coil, and dried thereafter.

Figure 2:
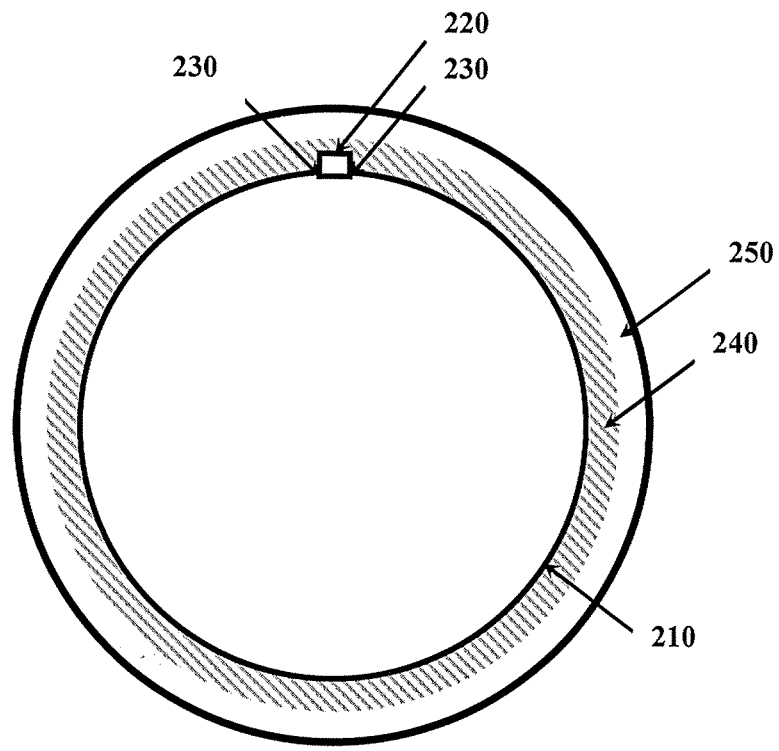
FIG. 2 is an illustration of one embodiment of the present invention.

FIG. 2 illustrates an etching device, another embodiment of the present invention. In the embodiment, an HTS wire 210 attached with high-Q capacitor 220 at its two ends 230 is tightly confined by a strong but flexible strip 240. In a preferred embodiment, the strip is a piece of commercially available high-density sponge to confine the coil in a circular shape and to minimize the contact of etching solution on the outer side of the wire. In this way, only the coatings on the inner side of the wire are removed while those on the outer side are retained. A support 250 holds the strip, which is rigid enough to maintain the strip in circular shape, and is chemically inert to the etching solution. In a preferred embodiment, a commercially available circular plastic dish is used.

Figure 3:
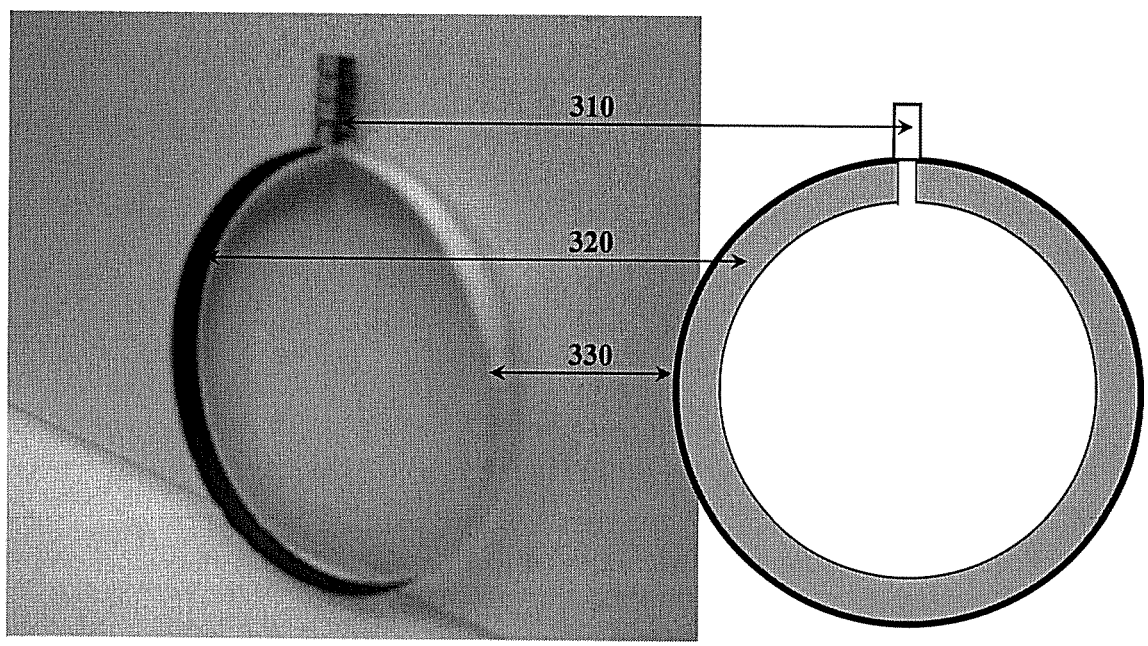
FIG. 3 presents an image of a HTS tape coil made in accordance with the present invention.

FIG. 3 presents an image and a schematic of a HTS tape coil (attached to high quality (high Q) capacitors 310) developed by the present method. The silver sheath on the inner side 320 of the coil is removed while that on the outer side 330 is retained.

For scanning in an MRI machine, a cryogenic system, which accommodates the HTS tape coil in liquid nitrogen, is connected to the appropriate imaging and control hardware in an MRI system, as would be known to one of skill in the art.

Figure 4A:
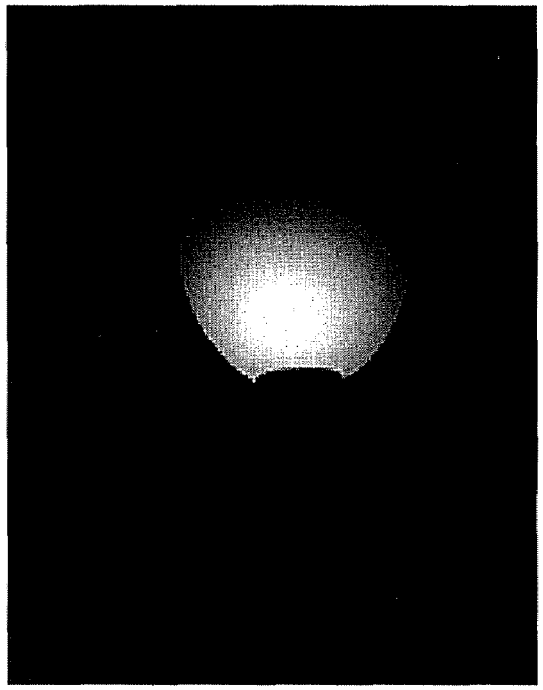
FIG. 4a presents an MRI scan of a phantom using the HTS tape coil of the present invention.
Figure 4B:
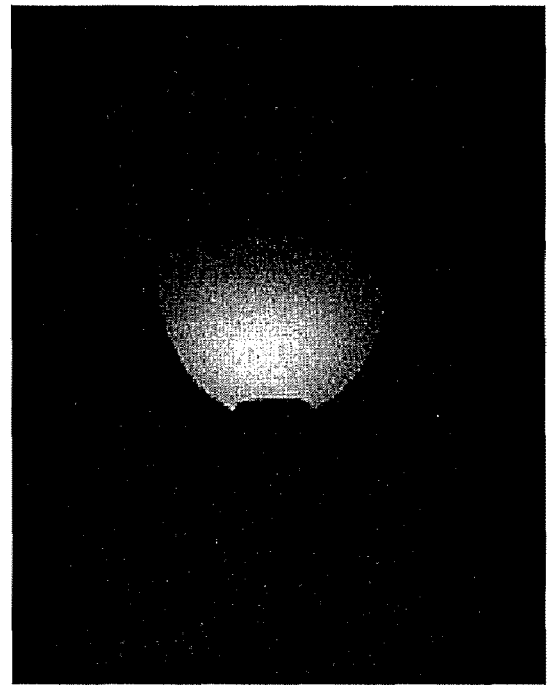
FIG. 4b presents an MRI scan of a phantom using copper coil as a control.
Figure 5A:
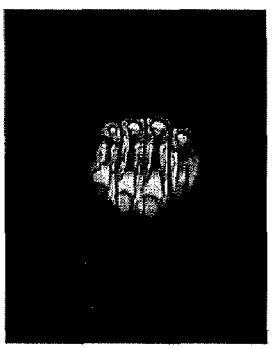
FIG. 5a presents an MRI scan of human fingers in an MRI apparatus including the HTS tape coil of the present invention.
Figure 5B:
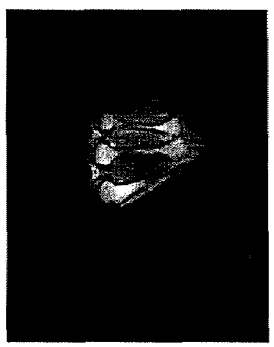
FIG. 5b presents an MRI scan of a human palm in an MRI apparatus including the HTS tape coil of the present invention.
Figure 5C:
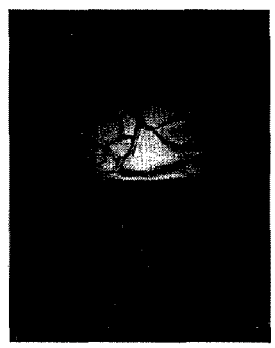
FIG. 5c presents an MRI scan of a human wrist in an MRI apparatus including the HTS tape coil of the present invention.
Figure 5D:
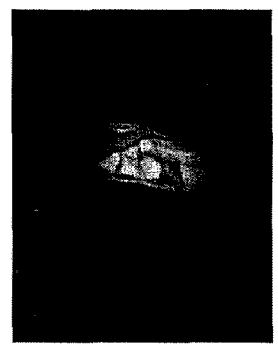
FIG. 5d presents an MRI scan of a human wrist in an MRI apparatus including the HTS tape coil of the present invention.

A phantom image is captured using a 6 cm single-turn HTS tape coil developed by the present method at 77 K, and its performance is compared to that using a conventional copper coil at 300 K. A sample is placed in the proximity of HTS tape coil and its image is captured with a conventional spin echo pulse sequence in a 0.21T MRI system. FIG. 4*a* presents an MRI scan of a phantom using a HTS tape coil developed by the present method and FIG. 4*b* shows an MRI scan of the same phantom using an equivalent copper coil. An SNR improvement of 3.5 times is obtained over the copper coil. Comparison of the images shows that the HTS tape coil produces higher quality images than the copper coil.

For further evaluation, we compared our coil to the 5-inch HTS tape coil discussed in Cheng, "HTS Tape RF Coil for Low Field MRI," *Proc. Intl. Soc Magn. Reson. Med.* (2003). Lee et al., "Performance of Large-Size Superconducting Coil in 0.21T MRI System," *IEEE Trans. on Biom. Eng.,* 51, 2024-2030 (2004), states that the SNR images obtained by a coil are inversely proportional to the square root of coil resistance and sample resistance. Results show that the coil resistance for the two coils is approximately the same (20 mΩ), while the sample resistances are in the order of one milliohm. Since the sample loss is reduced for the 6 cm coil, the SNR of the images obtained by the coil is higher. FIG. 5*a* to 5*d* present MRI scans of human fingers, hands and wrists using HTS tape coil developed with the present method, which demonstrate that this coil can achieve high quality in human imaging while protection for small size HTS tape coil.

Thus, the present method can effectively enhance the protection for HTS tape coil in particular for those of small size. The inner side of silver sheath is removed to avoid screening of the superconducting phase from RF signal, while the outer side is retained to increase the ability of the tape to resist against bending strain. This implies that small-size HTS tape coils for imaging of small human parts and animals can be much more easily realized. Potential applications include mice imaging in high field MRI system. It also makes a solenoid coil of small radius feasible.

Having thus described illustrative embodiments of the invention, various modifications and improvements will readily occur to those skilled in the art and are intended to be within the scope of the invention. Accordingly, the foregoing description is by way of example only and is not intended as limiting. The invention is limited only as defined in the following claims and the equivalents thereto.

What is claimed:

1. A method of manufacturing a high temperature superconducting (HTS) tape coil for an MRI device with enhanced protection, the method comprising:
   providing an HTS tape having an electrically conductive silver or silver alloy sheathing on an outer and inner side thereof;
   attaching a high-Q capacitor at each end of an HTS tape;
   removing using an etching solution of aqueous ammonium hydroxide and hydrogen peroxide substantially all of the silver or silver alloy electrically conductive sheathing on an inner side of the HTS tape while retaining substantially all of the electrically conductive silver or silver alloy sheathing material on the outer side of the HTS tape.

2. The method of claim a 1, wherein the etching solution contains 40% ammonium hydroxide.

3. The method of claim 2, wherein the etching solution contains 20% hydrogen peroxide.

4. The method of claim 1, further comprises providing an etching device comprising:
   an HTS tape attached with high-Q capacitors at two ends;
   a strong and flexible strip that tightly confines the HTS tape to minimize the contact of etching solution to the outer side of HTS tape; and
   a support that maintains the strip in a circular shape.

5. The method of claim 4, wherein the strip is contacted with a high-density sponge.

6. The method of claim 4, wherein the support is a circular plastic dish.

7. A high temperature superconducting (HTS) tape coil for an MRI device having enhanced protection against bending strain, comprising: an HTS tape with a high-Q capacitor at each end, the HTS tape having substantially all silver alloy sheathing removed from an inner side thereof, while retaining substantially all silver alloy sheathing from an outer side of the HTS tape.

8. An HTS tape coil having enhanced protection against bending strain made in accordance with the method of claim 1.

9. An HTS tape coil having enhanced protection against bending strain made in accordance with the method of claim 4.

10. An HTS tape coil having enhanced protection against bending strain made in accordance with the method of claim 3.

* * * * *